(12) United States Patent
Liao et al.

(10) Patent No.: US 7,736,982 B2
(45) Date of Patent: Jun. 15, 2010

(54) METHOD FOR FORMING A SEMICONDUCTOR DEVICE

(75) Inventors: Chin-I Liao, Tai-Nan (TW);
Chin-Cheng Chien, Tainan Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/251,438

(22) Filed: Oct. 14, 2008

(65) Prior Publication Data
US 2010/0093147 A1 Apr. 15, 2010

(51) Int. Cl.
*H01L 21/336* (2006.01)
(52) U.S. Cl. .................. 438/300; 438/483; 438/488
(58) Field of Classification Search .......... 438/482, 438/483, 488, 299, 300, 301
See application file for complete search history.

(56) References Cited

U.S. PATENT DOCUMENTS

| 6,346,729 | B1 * | 2/2002 | Liang et al. ........... 438/300 |
| 7,397,091 | B2 * | 7/2008 | Suenaga ............... 257/369 |
| 2007/0262396 | A1 | 11/2007 | Zhu et al. |
| 2008/0128746 | A1 * | 6/2008 | Wang ................. 257/190 |
| 2008/0265256 | A1 * | 10/2008 | Lin et al. ............. 257/70 |
| 2008/0277735 | A1 * | 11/2008 | Ko et al. .............. 257/369 |
| 2009/0045411 | A1 * | 2/2009 | Lin et al. .............. 257/77 |

\* cited by examiner

*Primary Examiner*—Kevin M Picardat
(74) *Attorney, Agent, or Firm*—Winston Hsu

(57) ABSTRACT

A method for forming a semiconductor device includes providing a substrate having at least a gate positioned thereon, forming at least a recess in the substrate adjacent to the gate, performing a first selective epitaxial growth (SEG) process to form a first epitaxial layer in the recess, performing an etching process to remove a portion of the first epitaxial layer to expose the substrate, and performing a second SEG process to form a second epitaxial layer on the first epitaxial layer.

20 Claims, 6 Drawing Sheets

METHOD FOR FORMING A SEMICONDUCTOR DEVICE

BACKGROUND OF THE INVENTION

1. Field of the Invention

The invention relates to a method for forming a semiconductor device, and more particularly, to a method for forming a semiconductor device with selective epitaxial growth (SEG) method.

2. Description of the Prior Art

As semiconductor processes advance to 65-nm node and beyond, and with the progress of device miniaturization, enhancing carrier mobility and a driving current of a Metal-Oxide-Semiconductor (MOS) transistor has become a critical issue. In order to improve a speed of the MOS transistor, a strained-silicon technique has been developed and is taken as a main solution to improve performance of the MOS transistor.

One approach of the strained-silicon technique is applied with selective epitaxial growth (SEG) method, which involves forming an epitaxial layer, such as a SiGe layer, on a single-crystalline silicon substrate while the crystalline orientation of the epitaxial layer is almost identical to that of the substrate. Because a lattice constant of the epitaxial SiGe layer is larger than that of silicon, such characteristic is employed to cause alteration to the band structure of the silicon in the channel region of the substrate. SEG method is widely applied in manufacturing numerous kinds of semiconductor devices, such as MOS transistors having raised source/drain regions which benefits from good short channel character and low parasitical resistance and MOS transistors having recessed source/drain which improves drain induced barrier lowering (DIBL) and punchthrough effect and reduces off-state current leakage and power consumption.

Please refer to FIGS. 1-2, which are schematic drawings illustrating a conventional method for manufacturing a MOS transistor utilizing SEG method. As shown in FIG. 1, a substrate 100 such as a silicon substrate is provided and a plurality of shallow trench isolation (STI) 102 is formed in the substrate 100. Then, a gate 110 is formed on the substrate 100 and followed by performing an ion implantation to form lightly doped drains (LDDs) 112 in the substrate 100 at two sides of the gate 110. Thus a channel region 114 is defined. Next, a spacer 116 is formed on sidewall of the gate 110 and recesses (not shown) are respectively formed in the substrate 100 at the two sides of the gate 110 by etching. Please still refer to FIG. 1. A SEG process is performed to form an epitaxial SiGe layer 120 along surfaces of the substrate 100 exposed in the bottom and sidewalls of the recess. And an ion implantation is performed before forming the recess or after the SEG process to form a recessed source/drain 118.

In principle, stress to the channel region 114 is increased as a Germanium (Ge) concentration in the epitaxial SiGe layer 120 is increased. Idealistically, the performance of the MOS transistor can be improved by increasing the Ge concentration. However, a thickness of the epitaxial SiGe layer 120 is limited by a critical thickness that is getting smaller when the Ge concentration is getting higher. If the thickness of the epitaxial SiGe layer 120 exceeds the critical thickness, it is relaxed and fails to cause stress to the channel region 114. Furthermore, when the Ge concentration in the epitaxial SiGe layer 120 is too high, a lattice mismatch between Si constituting the channel region 114 in the substrate 100 and SiGe becomes too high, thereby generating dislocation. As a result, stress provided by the epitaxial SiGe layer 120 is reduced, leakage current from the source/drain 188 is increased, and thus performance of the MOS transistor is deteriorated.

To avoid above-mentioned problem, the epitaxial SiGe layer 120 is formed with upward gradually-increasing Ge concentration by adjusting process factors during the SEG process. Or, as shown in FIG. 2, a multiple epitaxial SiGe layer 122, 124 is formed by performing different SEG processes with different process factors, while the epitaxial SiGe layer 124 possesses higher Ge concentration than the epitaxial SiGe layer 122. Those approaches are implied to improve stress to the channel region 114 under the critical thickness.

Please refer to FIG. 3, which is an enlarged schematic diagram of the epitaxial SiGe layer 120 in FIG. 2. It is well-known that the epitaxial layer 120 is formed along the surfaces of the substrate 100 at the bottom and sidewalls of the recess. The formation of the epitaxial SiGe layer 120 is proceeded as the upward growing epitaxial SiGe layer 120a, 120b, 120c, 120d, 120e shown in FIG. 3. Therefore, an islanding structure tightly adjacent to the spacer 116 is obtained as shown in FIG. 3. The islanding structure causes difficulties in following steps such as ion implantation or removing spacers, and eventually exerts influences upon the performance of the MOS transistor. It is noteworthy that due to the special growing characteristic found in the formation of the epitaxial layer, no matter if the epitaxial layer is formed as single epitaxial SiGe layer 120 having gradually-increasing Ge concentration which is obtained by adjusting process factors during one SEG process, or if the epitaxial layer is formed as a multiple epitaxial SiGe layer 122, 124 having different Ge concentration which is formed in different SEG process, said problem that the islanding structure tightly adjacent to the spacers 116 is always unavoidably found.

SUMMARY OF THE INVENTION

Therefore the present invention provides a method for forming a semiconductor device with SEG process that is able to avoid problems mentioned above.

According to the claimed invention, a method for forming a semiconductor device is provided. The method comprises steps of providing a substrate having a gate positioned thereon, forming at least a recess adjacent to the gate, performing a first selective epitaxial growth (SEG) process to form a first epitaxial layer in the recess, performing an etching process to remove a portion of the first epitaxial layer to expose the substrate, and performing a second SEG process to form a second epitaxial layer on the first epitaxial layer.

According to the method for forming a semiconductor device provided by the present invention, the etching process is introduced to remove the first epitaxial layer till the a portion of the substrate is exposed, thus the second epitaxial layer is to be formed along the etched plane profile of the first epitaxial layer after the etching process. Since the Ge concentration of the second epitaxial layer is higher than that of the first epitaxial layer, facet angles of the two epitaxial layers are different, and thus the included angle between the horizontal plane and the inclined plane of the islanding structure of the second epitaxial layer is larger than that of the first epitaxial layer. Consequently, contact areas between the second epitaxial layer and the spacer are reduced, and thus difficulties during removing the spacers and ion implantation performed afterwards are also reduced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
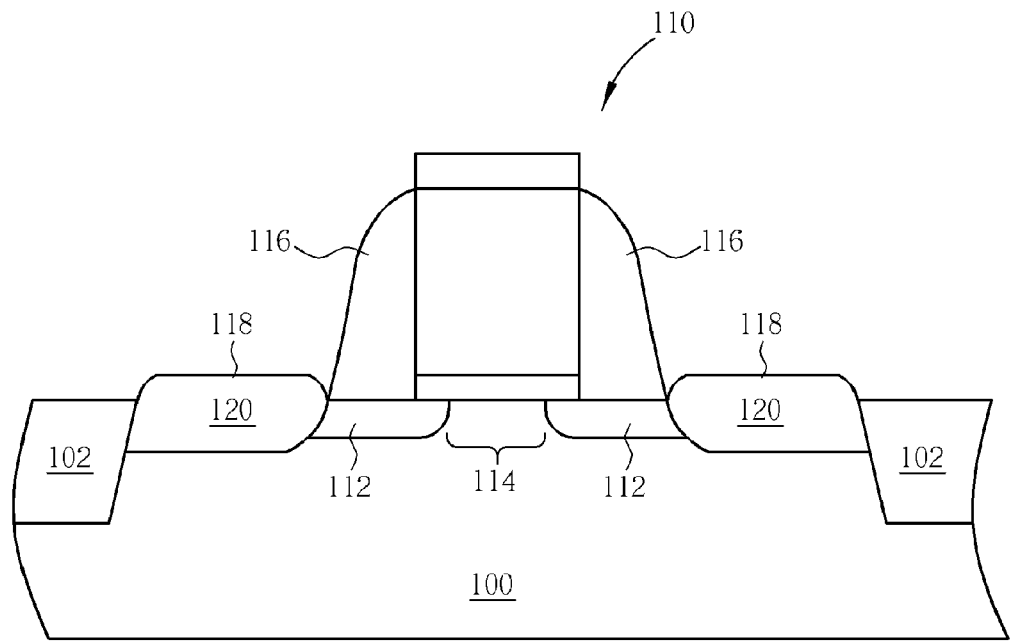
FIGS. 1-2 are schematic drawings illustrating a conventional method for manufacturing a MOS transistor utilizing SEG technology.
Figure 2:
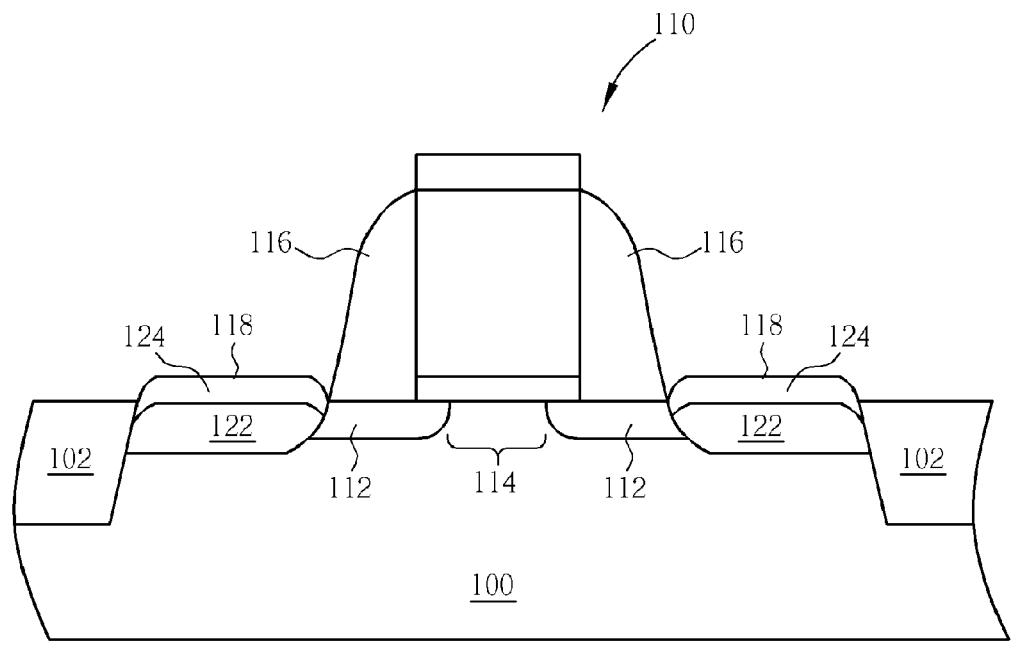
Figure 3:
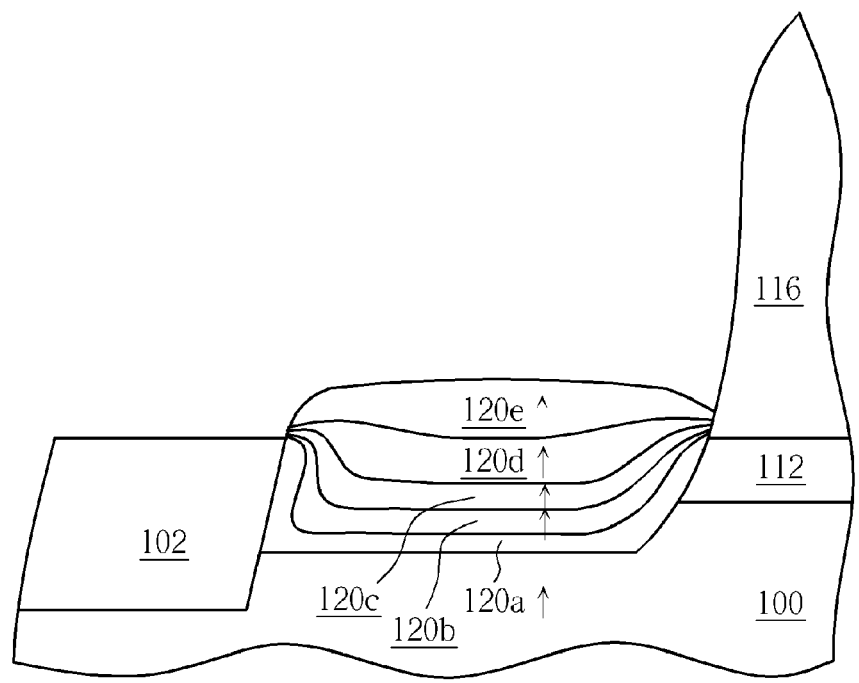
FIG. 3 is an enlarged schematic diagram of the epitaxial SiGe layer in FIG. 2.
Figure 4:
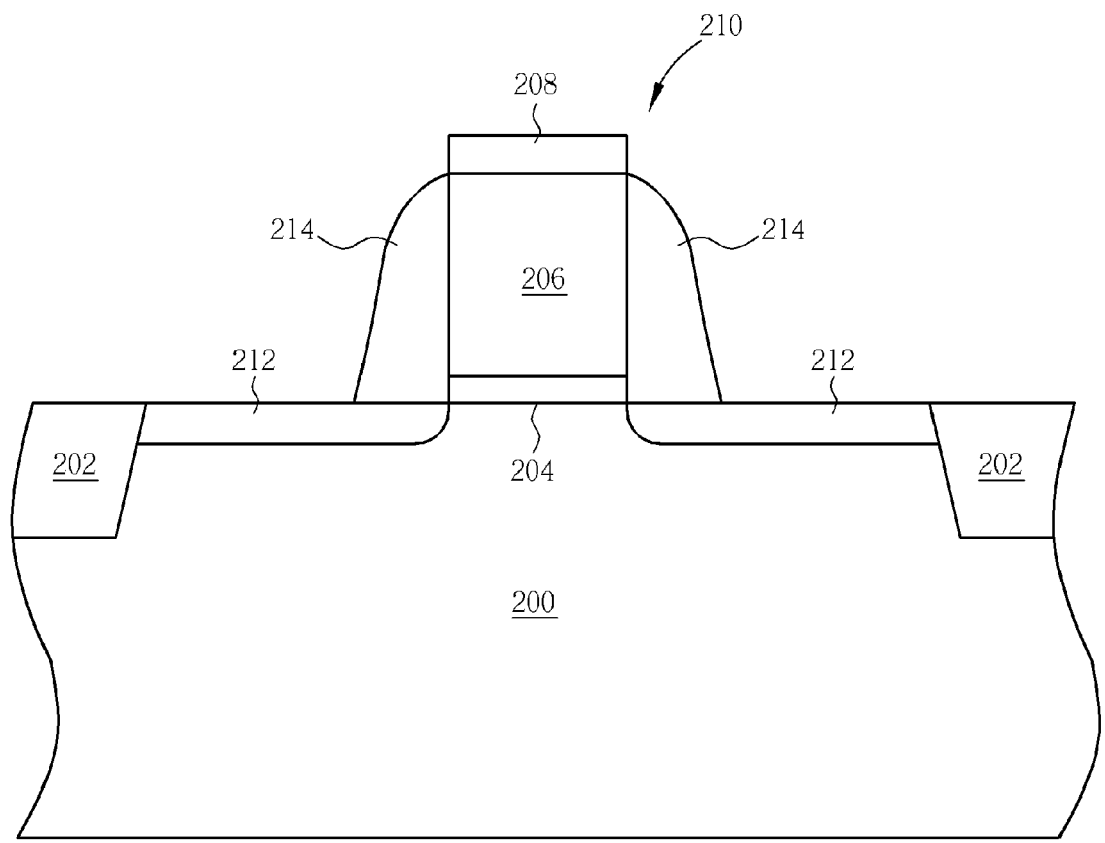
FIGS. 4-8 are schematic drawings illustrating a method for forming a semiconductor device according to a first preferred embodiment of the present invention.

Please refer to FIGS. 4-8, which are schematic drawings illustrating a method for forming a semiconductor device according to a first preferred embodiment of the present invention. As shown in FIG. 4, a substrate 200, such as a silicon substrate, having a plurality of shallow trench isolation (STI) 202 serving for electrically isolating different semiconductor devices is provided. Then a patterned hard mask layer 208 used to define a gate dielectric layer 204 and a gate conductive layer 206 is formed, then a gate 210 is following formed.

Figure 5:
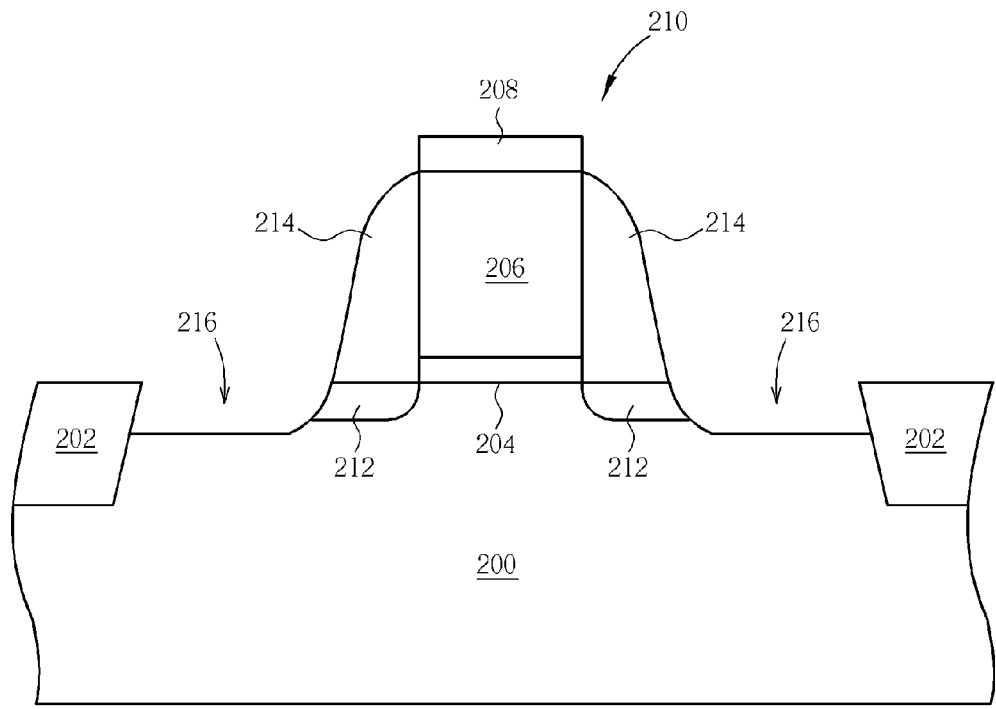

Please refer to FIGS. 4-5. A first ion implantation is performed to form lightly doped drains (LDDs) 212 in the substrate 200 at two sides of the gate 210 and followed by forming a spacer 214 on sidewall of the gate 210. With the patterned hard mask layer 208 and the spacer 214 serving as masks during an etching process, recesses 216 are formed in the substrate 200 at two sides of the gate 210, as shown in FIG. 5.

Figure 6:
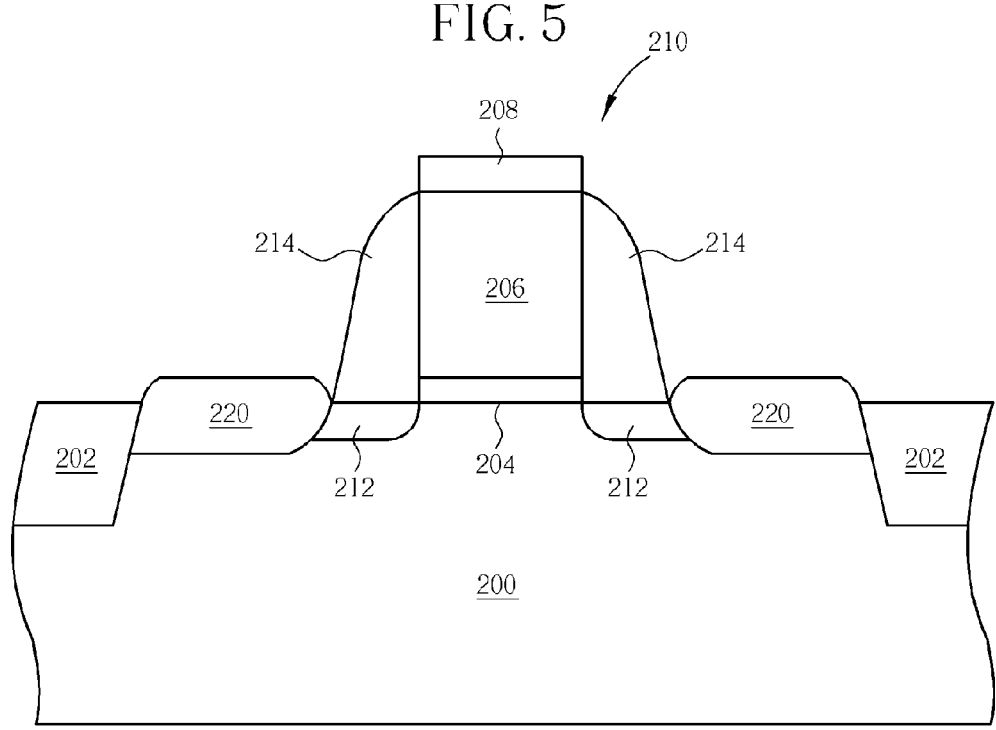

Please refer to FIG. 6. After forming the recess 216, a pre-clean process is performed, and then a baking process is performed by using a temperature between 700° C. and 950° C. to remove the remaining oxides from the surface of the recess 216 and repair the surface roughness of the recess 216. Then, a first SEG process is performed to form a first epitaxial layer 220 respectively in the recess 216. Additionally, the pre-clean process can be performed in a high-vacuum chamber to avoid native oxide. Said high-vacuum chamber and a chamber in which the first SEG process is performed can be included in one cluster tool. Furthermore, it is well-known that the chamber for the SEG process possesses cleaning function as well, therefore the pre-clean process and the first SEG process can be in-situ performed.

The first epitaxial layer 220 comprises a first material such as Ge or C, and a lattice constant of the first material is different from that of the substrate 200. In the first preferred embodiment, the first material is Ge and the first epitaxial layer 220 comprises SiGe. The first material is provided with a first concentration, which means a Ge concentration in the SiGe. The first concentration is lower than 22%. In the first preferred embodiment, a surface of the first epitaxial layer 220 is higher than a surface of the substrate 200. However, in modifications of the first preferred embodiment, the surface of the first epitaxial layer 220 can be lower than that of the substrate 200; or the surfaces of the substrate 200 and the first epitaxial layer 220 can be coplanar. It is noteworthy that the first epitaxial layer 220 grows along the surfaces of substrate 200 in the bottom and sidewalls of the recess 216, thus an islanding structure as shown in FIG. 6 is obtained.

Figure 7:
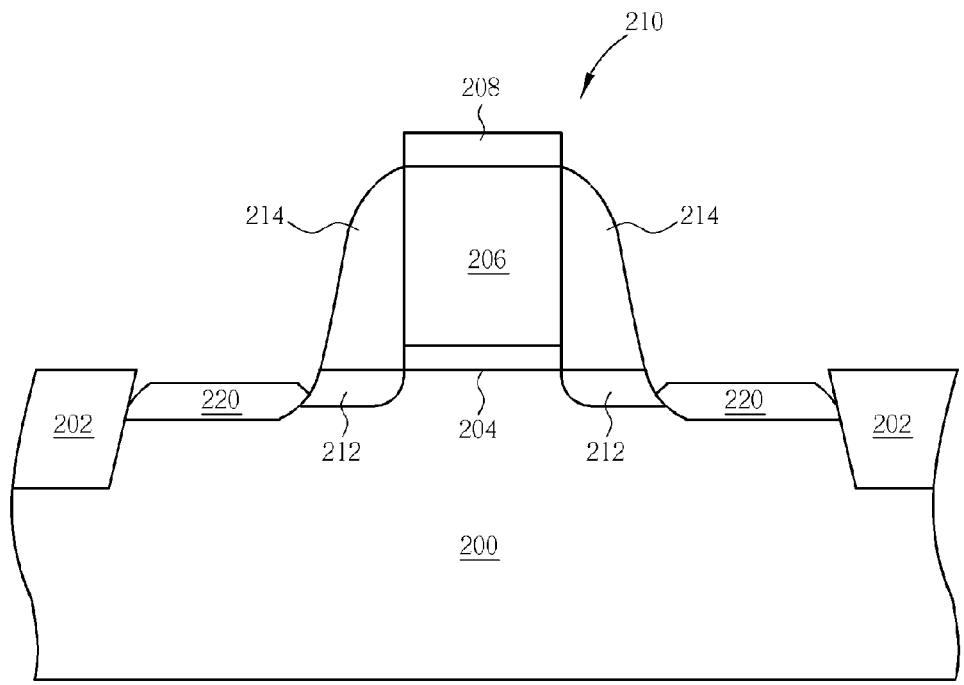

Please refer to FIG. 7. Next, an etching process is performed to remove a portion of the first epitaxial layer 220 till the substrate 200 under the spacer 214 is exposed, and thus an etched plane is obtained. The etching process can be an isotropic etching or anisotropic etching process. Said etching process includes, for instance, a wet etching process, a dry etching process, a reactive ion etching (RIE) process, or a vapor etching process, while the anisotropic etching process is preferred. When the etching process and the first SEG process are ex-situ performed, a buffer oxide etchant (BOE) is further rendered to remove native oxide.

Figure 8:
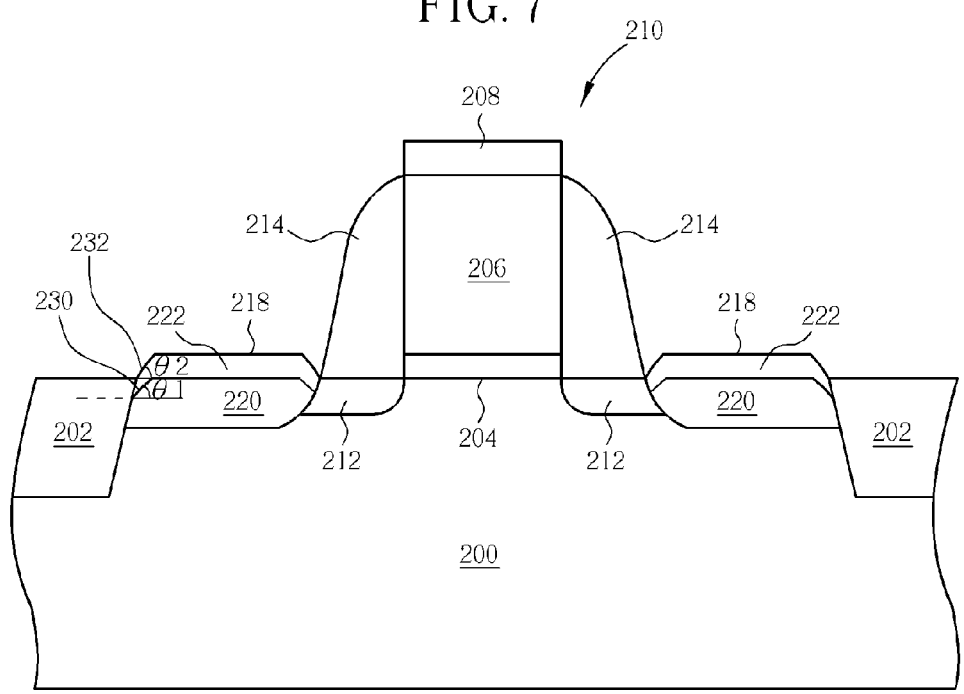

Please refer to FIG. 8. A second SEG process is performed to form a second epitaxial layer 222 on the first epitaxial layer 220 respectively in the recesses 216. The second epitaxial layer 222 comprises a second material such as Ge or C having a lattice constant different from the lattice constant of the substrate 200. In the first preferred embodiment, the second material is Ge and the second epitaxial layer 222 comprises SiGe. The second material is not limited to being similar or different from the first material. The second material is formed with a second concentration, which is the Ge concentration in the SiGe. The second concentration is higher than the first concentration, exemplarily between 25% and 40%. Furthermore, the first epitaxial layer 220 and the second epitaxial layer 222 can comprise dopants such as Boron (B) depending on whether a P-type or N-type semiconductor device is to be formed. And the dopants are in-situ implanted with the first SEG process or the second SEG process.

Please still refer to FIG. 8. According to the first preferred embodiment, the first epitaxial layer 220 possesses an inclined plane 230. The inclined plane 230 and a horizontal plane have a first included angle $\theta_1$. Because the concentration of the second material in the second epitaxial layer 222 is higher that of the first material in the first epitaxial layer 220, the facet angle is considerably different between the first epitaxial layer 220 and the second epitaxial layer 222. After forming the second epitaxial layer 222, it is found that the second epitaxial layer 222 also possesses an inclined plane 232, and the inclined plane 232 and the horizontal plane have a second included angle $\theta_2$. The second included angle $\theta_2$ is larger than the first included angle $\theta_1$. Then a second ion implantation is performed to form a source/drain 218 respectively in the epitaxial layer 220, 222 and the substrate 200 at two sides of the gate 210.

According to the first preferred embodiment, the Ge or C concentration of the SiGe or SiC of the first epitaxial layer 220 is not high enough, difference between the lattice constants of the first epitaxial layer 220 and the substrate 200 is therefore smaller, thus defects such as dislocation and its adverse influences such as reduced stress and increased leakage current are improved. And by forming the second epitaxial layer 222 near the channel region, proper stress is provided due to the higher Ge or C concentration of the second material, and thus performance of the MOS transistor is improved. In the first preferred embodiment, the first epitaxial layer 220 is etched to expose a portion of the substrate 200 by the etching process, therefore the second epitaxial layer 222 is formed along the etched plane of the first epitaxial layer 220 as shown in FIG. 8, not along the deposited surface of the epitaxial layer 220 as prior observed. Secondly, as mentioned above, since the Ge or C concentration in the second epitaxial layer 222 is higher than that in the first epitaxial layer 220, the facet angles between the two epitaxial layers are different. As shown in FIG. 8, the second included angle $\theta_2$ formed between the inclined plane of the second epitaxial layer 222 and the horizontal plane is larger than the first included angle $\theta_1$ formed between the inclined plane of the first epitaxial layer 220 and the horizontal plane, therefore contact areas between the second epitaxial layer 222 and the spacer 214 are reduced, and thus difficulties during the ion implantation performed afterwards and damages to the second epitaxial layer 222 when removing the spacers 214 are both reduced.

Figure 9:
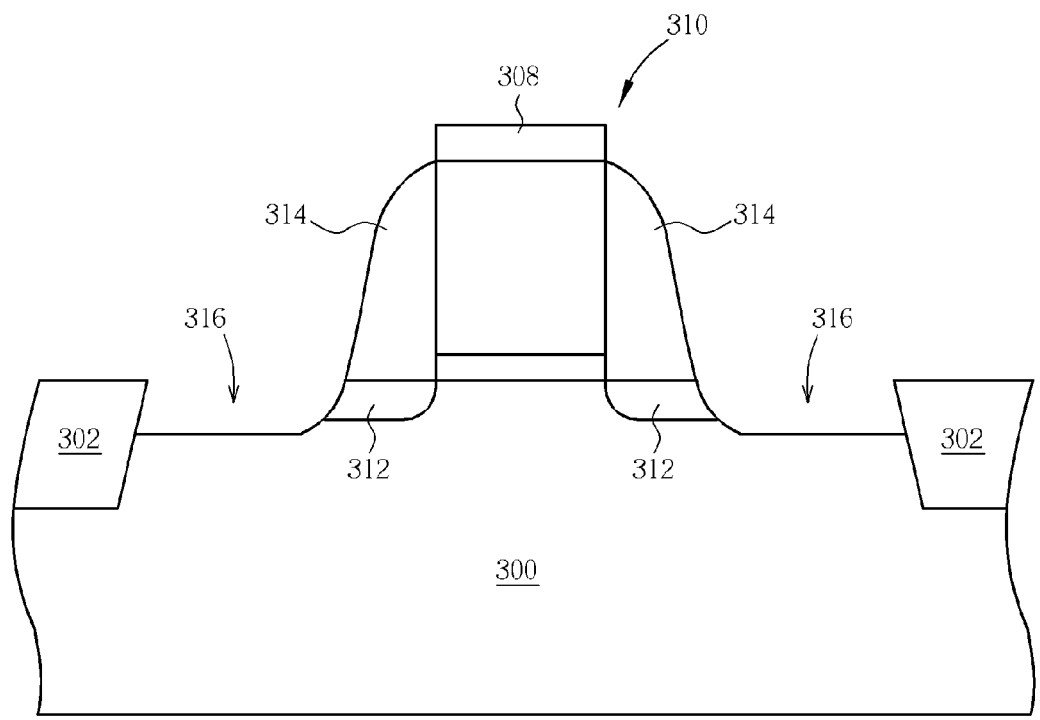
FIGS. 9-12, which are schematic drawings illustrating a method for forming a semiconductor device according to a second preferred embodiment of the present invention.

FIGS. 9-12, which are schematic drawings illustrating a method for forming a semiconductor device according to a second preferred embodiment of the present invention. As shown in FIG. 9, a substrate 300, such as a silicon substrate, having a plurality of STI 302 serving for electrically isolating different devices is provided. And at least a gate 310 and its LDDs 312 and spacer 314 are formed on the substrate 300. Because formations of those elements are similar with the first preferred embodiment, such details are omitted herein in the interest of brevity.

Please still refer to FIG. 9. Then, a patterned hard mask layer 308 and the spacer 314 serve as etching masks when recesses 316 are respectively formed in the substrate 300 at two sides of the gate 310. After forming the recess 316, a pre-cleaning process is performed and followed by a baking process. The baking process is performed a temperature between 750° C. and 950° C. to remove the remaining oxides from the surface of the recess 316 and repair the surface roughness of the recess 316. As mentioned above, the pre-clean process can be performed in a high-vacuum chamber to avoid native oxide. Said high-vacuum chamber and a chamber in which the following first SEG process is performed can be included in one cluster tool. Said pre-clean process and the first SEG process can be in-situ performed.

Figure 10:
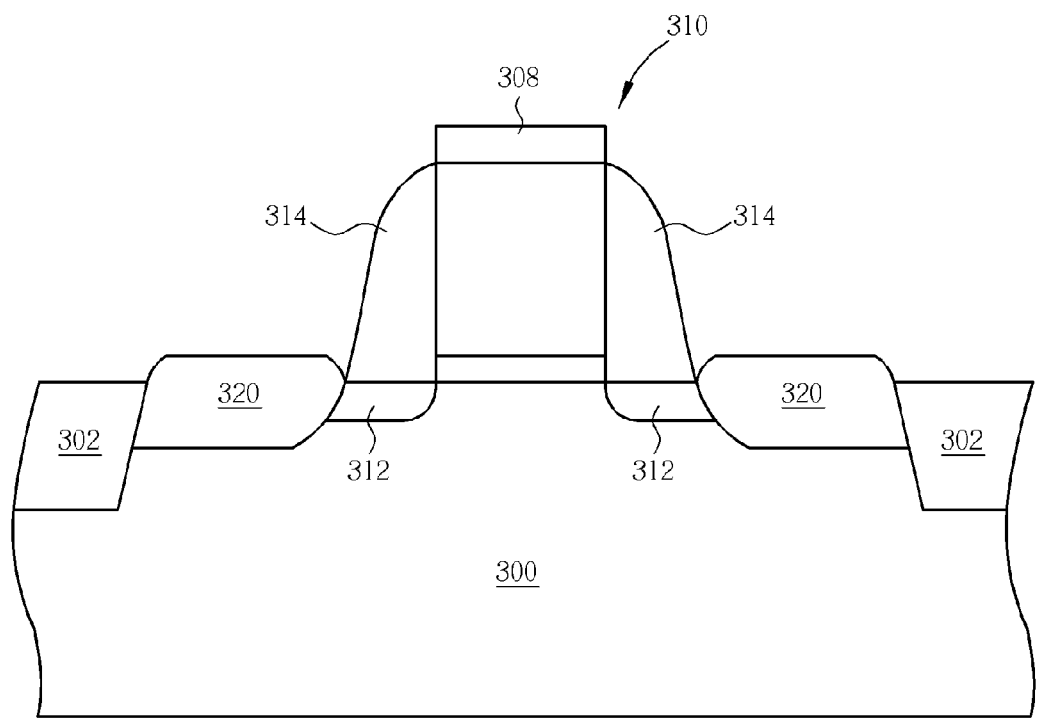

Please refer to FIG. 10. A first SEG process is performed to form a first epitaxial layer 320 in the recess 316. The first epitaxial layer 320 comprises a first material such as Ge or C. A lattice constant of the first material is different from that of the substrate 300. In the second preferred embodiment, the first material is Ge; and the first epitaxial layer 320 is SiGe. The first material is provided with a first concentration, which means the Ge concentration of the SiGe, and the first concentration is lower than 22%. Also in the second preferred embodiment, a surface of the first epitaxial layer 320 is higher than a surface of the substrate 300. However, in modifications of the second preferred embodiment, the surface of the first epitaxial layer 320 can be lower than that of the substrate 300; or the surfaces of the substrate 300 and the first epitaxial layer 320 can be coplanar. As mentioned above, the first epitaxial layer 320 is formed along the surfaces of the substrate 300 at the bottom or sidewalls of the recess 316, thus an islanding structure is obtained as shown in FIG. 10.

Figure 11:
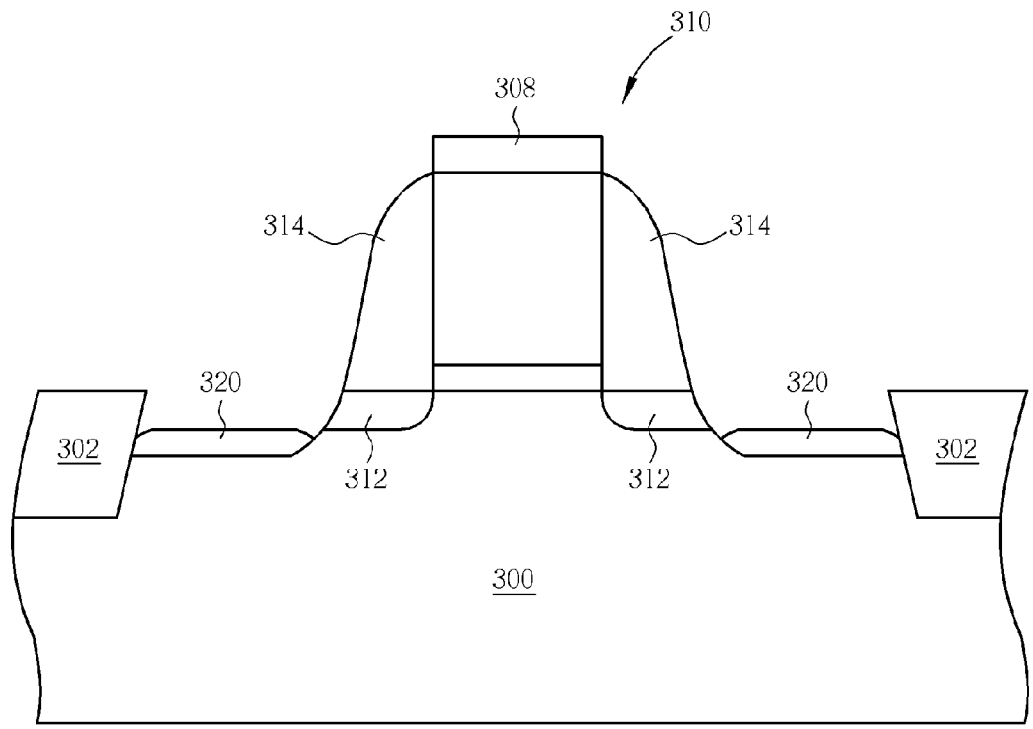

Please refer to FIG. 11. Next, an etching process is performed to remove a portion of the first epitaxial layer 320 till the substrate 300 under the spacers 314 is exposed. The etching process can be an isotropic etching or anisotropic etching process. Said etching process includes, for instance, a wet etching process, a dry etching process, a RIE process, or a vapor etching process, while the anisotropic etching process is preferred. As mentioned above, when the etching process and the first SEG process are ex-situ performed, a BOE is further rendered to remove native oxide.

Figure 12:
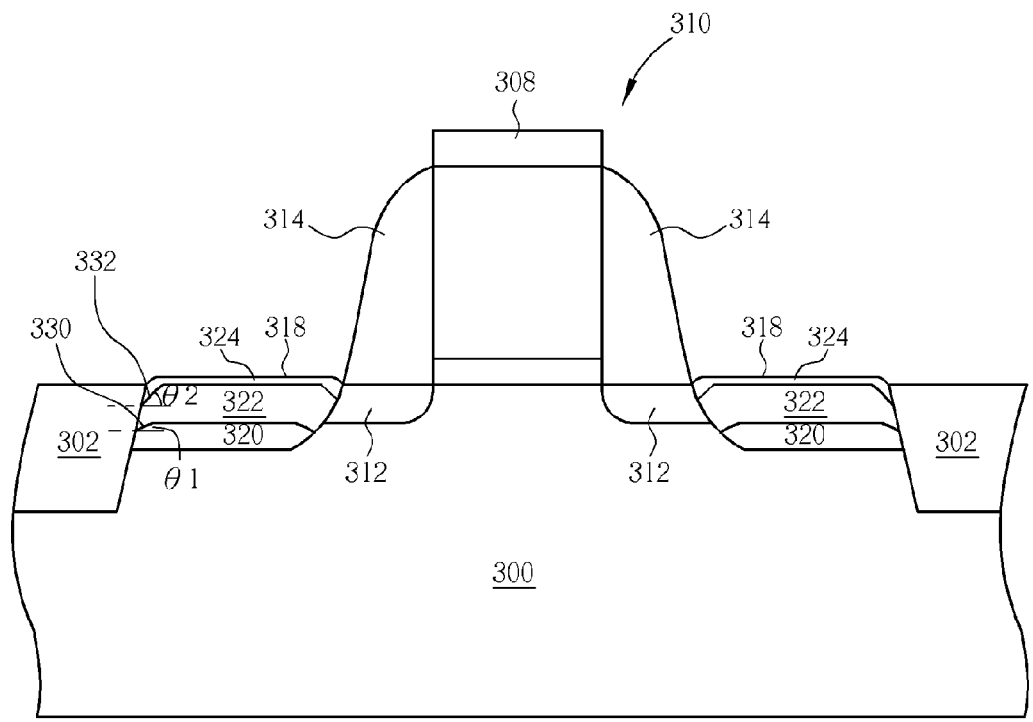

Please refer to FIG. 12. A second SEG process and a third SEG process are serially performed to form a second epitaxial layer 322 and a third epitaxial layer 324 on the first epitaxial layer 320 in the recess 316, sequentially. The second epitaxial layer 322 and the third epitaxial layer 324 respectively comprise a second material and a third material such as Ge or C. And Lattice constants of the second material and the third material are both different from that of the substrate 300. In the second preferred embodiment, the second material and the third material are Ge, which means that the second epitaxial layer 322 and the third epitaxial layer 324 are both SiGe. However, the second material and the third material are not limited to being similar or different from the first material. According to other modification of the second preferred embodiment, SEG processes can be selectively performed after the third SEG process depending on required condition for forming further epitaxial layers with different concentrations. Furthermore, before performing the above-mentioned SEG processes, etching processes are also selectively performed to former epitaxial layer if required.

The second material is provided with a second concentration, which means the Ge concentration of the SiGe, and the second concentration is higher than the first concentration, exemplarily between 25% and 40%. It is noteworthy that according to the second preferred embodiment, the third material is provided with a third concentration, which is the Ge concentration of SiGe. And the third concentration is lower than the first concentration of the first material. Additionally, the first material, the second material and the third material can comprise dopants such as B depending on whether P-type or N-type semiconductor device is formed. And the dopants are in-situ implanted with the first SEG process, the second SEG process or the third SEG process.

As mentioned above, since the concentration of the second material in the second epitaxial layer 322 is higher than the concentration of the first material in the first epitaxial layer 320, facet angles of the first epitaxial layer 320 and the second epitaxial layer 322 are different. It also is found that a second included angle $\theta_2$ formed between an inclined plane of the second epitaxial layer 322 and a horizontal plane is larger than a first included angle $\theta_1$ formed between an inclined plane of the first epitaxial layer 320 and the horizontal plane.

According to the second preferred embodiment, the Ge or C concentration of the SiGe or SiC of the first epitaxial layer 320 is not high enough, difference between the lattice constants of the first epitaxial layer 220 and the substrate 200 is therefore smaller, thus defects such as dislocation and its adverse influences such as reduced stress and increased leakage current is improved. And by forming the second epitaxial layer 322 near the channel region, proper stress is provided due to the higher Ge or C concentration of the second material, and thus performance of the MOS transistor is improved. As described in the first preferred embodiment, the first epitaxial layer 320 is etched to expose a portion of the substrate 300 by the etching process, therefore the second epitaxial layer 322 is formed along the etched plane of the first epitaxial layer 320 as shown in FIG. 12, not along the deposited surface of the epitaxial layer 320 as prior observed. Secondly, as mentioned above, since the Ge or C concentration in the second epitaxial layer 322 is higher than that in the first epitaxial layer 320, the facet angles between the two epitaxial layers are different. As shown in FIG. 12, the second included angle $\theta_2$ formed between the inclined plane of the second epitaxial layer 322 and the horizontal plane is larger than the first included angle $\theta_1$ formed between the inclined plane of the first epitaxial layer 320 and the horizontal plane, therefore contact areas between the second epitaxial layer 322 and the spacer 314 are reduced, and thus difficulties during the ion implantation performed afterwards and damages to the second epitaxial layer 322 when removing the spacers 314 are both reduced.

Additionally, a self-aligned silicide (salicide) process is preferably performed after forming the source/drain 218/318 in the first preferred embodiment and the second preferred embodiment for improving Ohmic contact between metal contact plugs and the gate 210/310, source/drain 218/318: forming a metal layer comprising Titanium (Ti) or Nickel (Ni) on surfaces of gate 210/310 and the source/drain 218/318 comprising epitaxial layers, then performing RTA processes to react the metal layer with silicon in the gate 210/310 and the source/drain 218/318, thus salicide is formed to reduce sheet resistance of the source/drain 218/318. It is well-known that with increasing Ge concentration of the epitaxial layers, stability of the salicide is reduced, and thus resistance and leakage currents are both increased, which worsen performance of the semiconductor device. According to the second preferred embodiment, the Ge concentration in the third epitaxial layer 324 is lower than that in the first epitaxial layer 320, even lower than Ge concentration conventionally required in strained-silicon technique. Therefore influences upon stability of the salicide are avoided, and thus resistance is relatively reduced and performance of the semiconductor device is improved.

Please refer to FIGS. 5-8 and FIGS. 9-12 again. According to a third preferred embodiment provided by the present invention, the first SEG process, the etching process, and the second SEG process, and following required etching process and SEG process, are performed in-situ. In the first SEG process, the etching process, and the second SEG process, Dischlorosilane (DCS), HCl, and precursors such as $GeH_4$ are introduced. By adjusting factors such as process durations and flow rates of those gases mentioned above, the first SEG process, the etching process, and the second SEG process are integrated. In the third preferred embodiment, a ratio of process durations of the SEG process, the etching process, and the second SEG process is about 8:3:2. Furthermore, a flow rate of HCl in the etching process is higher than that in the first and second SEG processes, such as 2 to 4 times, thus the etching rate is higher than the growth rate during the etching process. Accordingly, the first epitaxial layer 220/320 is etched to expose the substrate 200/300 under the spacer 214/314. And the etched planes of the first epitaxial layers 220/320 are obtained. The second epitaxial layer 222/322 and the third epitaxial layer 324 are formed along the etched plane of the first epitaxial layer 220/320 in the second SEG process and the third SEG process. As mentioned above, because the concentration of the second material in the second epitaxial layer 222/322 is higher that of the first material in the first epitaxial layer 220/320, the facet angle is considerably different between the first epitaxial layer 220/320 and the second epitaxial layer 222/322. As shown in FIGS. 8 and 12, the second included angle $\theta_2$ formed between the inclined plane of the second epitaxial layer 222/322 and the horizontal plane is larger than the first included angle $\theta_1$ formed between the inclined plane of the first epitaxial layer 220/320 and the horizontal plane, therefore contact areas between the second epitaxial layer 222/322 and the spacer 214/314 are reduced, and thus difficulties during the ion implantation performed afterwards and damages to the second epitaxial layer 222/322 when removing the spacers 214/314 are both reduced.

According to the method for forming a semiconductor device provided by the present invention, a multiple epitaxial layer made of at least two epitaxial layers with different concentrations is formed. Said epitaxial layers comprise material such as Ge or C that has lattice constant larger than the lattice constant of the silicon substrate. The first epitaxial layer with lower Ge concentration is formed in the bottom of the recess for reducing dislocation and its adverse influence such as reduced stress and increased leakage current while the second epitaxial layer with higher Ge concentration is formed near the channel region for providing the desired stress. More important, the first epitaxial layer is etched to expose the substrate by the etching process, therefore the second epitaxial layer is formed along the etched plane of the first epitaxial layer. Secondly, it is observed that the facet angles of the first epitaxial layer and the second epitaxial layer are different due to the higher Ge or C concentration of the second epitaxial layer. Accordingly, the included angle formed between the inclined plane of the second epitaxial layer and the horizontal plane is larger that the included angle formed between the inclined plane of the first epitaxial layer and the horizontal plane. Multiplication of the two approaches effectively reduce contact areas between the second epitaxial layer and the spacer, and thus damages to the second epitaxial layer during removing the spacers are prevented and adverse influences to the profile of dopants after the ion implantation are avoided.

Those skilled in the art will readily observe that numerous modifications and alterations of the device and method may be made while retaining the teachings of the invention.

What is claimed is:

1. A method for forming a semiconductor device comprising steps of:
   providing a substrate having at least a gate positioned thereon;
   forming at least a recess adjacent to the gate;
   performing a first selective epitaxial growth (SEG) process to form a first epitaxial layer in the recess;
   performing an etching process to remove a portion of the first epitaxial layer to expose the substrate, wherein the first epitaxial layer has a first incline plane with a first included angle in respect to a horizontal plane; and
   performing a second SEG process to form a second epitaxial layer on the first epitaxial, wherein the second epitaxial layer has a second inclined plane with a second included angle in respect to the horizontal plane, and the second included angle is different from the first included angle.

2. The method of claim 1, wherein a surface of the first epitaxial layer is higher than a surface of the substrate.

3. The method of claim 1, wherein a surface of the first epitaxial layer and a surface of the substrate are coplanar.

4. The method of claim 1, wherein a surface of the first epitaxial layer is lower than a surface of the substrate.

5. The method of claim 1, wherein the etching process is an anisotropic etching process.

6. The method of claim 5, wherein the anisotropic etching process comprises a wet etching process, a dry etching process, a reactive ion etching (RIE) process, or a vapor etching process.

7. The method of claim 1 further comprising a step of in-situ implanting dopants performed with the first SEG process and the second SEG process.

8. The method of claim 1, wherein the first epitaxial layer and the second epitaxial layer respectively comprise a first material with a first concentration and a second material with a second concentration, and lattice constants of the first material and the second material are different from a lattice constant of the substrate.

9. The method of claim 8, wherein the first material and the second material respectively comprise Germanium (Ge) or Carbon (C).

10. The method of claim 9, wherein the first material is similar with the second material.

11. The method of claim 9, wherein the first material is different from the second material.

12. The method of claim 8, wherein the second concentration is higher than the first concentration.

13. The method of claim 12, wherein the first concentration is lower than 22%.

14. The method of claim 12, wherein the second concentration is between 25% and 40%.

15. The method of claim 8 further comprising a step of performing a third SEG process to form a third epitaxial layer on the second epitaxial layer.

16. The method of claim 15, wherein the third epitaxial layer comprises a third material with a third concentration, and a lattice constant of the third material is different from the lattice constant of the substrate.

17. The method of claim 16, wherein the third concentration is lower than the first concentration.

18. The method of claim 1 further comprising the following steps performed before forming the recess:
   performing a first ion implantation to form lightly doped drains (LDDs) in the substrate respectively at two sides of the gate; and
   forming a spacer on a sidewall of the gate.

19. The method of claim 18 further comprising a step of performing a second ion implantation to form a source/drain at two sides of the gate.

20. The method of claim 1, wherein the first SEG process, the etching process, and the second SEG process are performed in-situ.

* * * * *